United States Patent
Umeda et al.

(10) Patent No.: US 10,727,807 B2
(45) Date of Patent: Jul. 28, 2020

(54) RESONATOR MANUFACTURING METHOD

(71) Applicant: Murata Manufacturing Co., Ltd., Nagaokakyo-shi, Kyoto-fu (JP)

(72) Inventors: Keiichi Umeda, Nagaokakyo (JP); Hiroshi Yamada, Nagaokakyo (JP); Yasuhiro Aida, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 419 days.

(21) Appl. No.: 15/610,896

(22) Filed: Jun. 1, 2017

(65) Prior Publication Data

US 2017/0272050 A1    Sep. 21, 2017

Related U.S. Application Data

(63) Continuation of application No. PCT/JP2015/082672, filed on Nov. 20, 2015.

(30) Foreign Application Priority Data

Dec. 26, 2014 (JP) ................. 2014-265347

(51) Int. Cl.
| | |
|---|---|
| *H03H 9/02* | (2006.01) |
| *H03H 9/17* | (2006.01) |
| *H03H 3/007* | (2006.01) |
| *H03H 9/24* | (2006.01) |
| *B81B 3/00* | (2006.01) |

(52) U.S. Cl.
CPC ....... *H03H 9/02102* (2013.01); *B81B 3/0081* (2013.01); *H03H 3/0072* (2013.01); *H03H 3/0076* (2013.01); *H03H 9/02259* (2013.01); *H03H 9/17* (2013.01); *H03H 9/171* (2013.01); *H03H 9/2463* (2013.01); *H03H 9/2489* (2013.01); *B81C 2201/0181* (2013.01); *H03H 2009/02496* (2013.01); *H03H 2009/241* (2013.01)

(58) Field of Classification Search
None
See application file for complete search history.

(56) References Cited

U.S. PATENT DOCUMENTS

| | | |
|---|---|---|
| 9,905,748 B2 | 2/2018 | Nishimura et al. |
| 2002/0190814 A1 | 12/2002 | Yamada et al. |
| 2005/0093397 A1 | 5/2005 | Yamada et al. |

(Continued)

FOREIGN PATENT DOCUMENTS

| | | |
|---|---|---|
| JP | H02-275621 A | 11/1990 |
| JP | 2001-168675 A | 6/2001 |
| JP | 2005-236338 A | 9/2005 |

(Continued)

OTHER PUBLICATIONS

International Search Report issued in International Patent Application No. PCT/JP2015/082672, dated Dec. 22, 2015.

(Continued)

*Primary Examiner* — Asok K Sarkar
(74) *Attorney, Agent, or Firm* — Arent Fox LLP

(57) ABSTRACT

A method for manufacturing a resonator that effectively addresses variations in resistivity for each wafer. The method for manufacturing a resonator includes forming a Si oxide film on a surface of a degenerated Si wafer, where the Si oxide film has a thickness set that is based on the doping amount of impurity in the degenerated Si wafer.

14 Claims, 12 Drawing Sheets

(56) References Cited

U.S. PATENT DOCUMENTS

2016/0064642 A1    3/2016   Nishimura et al.

FOREIGN PATENT DOCUMENTS

| | | |
|---|---|---|
| JP | 2007-019758 A | 1/2007 |
| JP | 2009-239860 A | 10/2009 |
| JP | 2010-028536 A | 2/2010 |
| WO | WO 2014/185280 A1 | 11/2014 |

OTHER PUBLICATIONS

Written Opinion of the International Searching Authority issued in International Patent Application No. PCT/JP2015/082672, dated Dec. 22, 2015.

RESONATOR MANUFACTURING METHOD

CROSS REFERENCE TO RELATED APPLICATIONS

The present application is a continuation of PCT/JP2015/082672 filed Nov. 20, 2015, which claims priority to Japanese Patent Application No. 2014-265347, filed Dec. 26, 2014, the entire contents of each of which are incorporated herein by reference.

TECHNICAL FIELD

The present disclosure relates to a method for manufacturing a resonator.

BACKGROUND

Before resonators, such as piezo-resonators, are formed, ingots of Si (silicon) are manufactured that are doped with large amounts of impurities, such as n-type dopants like P (phosphorus), for example. Then, a plurality of wafers are cut out from these ingots, and resonators are formed in a plurality of zones defined on the wafers. Thereafter, the respective zones are cut along the outlines of the respective zones of the wafers to thereby form resonance devices.

The ingots of Si are manufactured substantially in cylindrical shapes by the growth of single-crystalline Si according to, for example, a manufacturing method referred to as a CZ method (Czochralski method). For example, the ingots are manufactured by melting, on heating, polycrystalline Si doped with large amounts of n-type dopant, for example, such as P, and immersing Si rods in the molten Si, and lifting the Si rods while rotating the rods.

Patent Document 1: Japanese Patent Application Laid-Open No. 2010-028536.

It has been determined that these ingots each have a higher impurity concentration at the outer peripheral side in a radial direction of the ingot than at the inner peripheral side therein. At the same time, these ingots also have a higher impurity concentration at the bottom side in a lifting direction of the ingot than the top side therein. In accordance with these distributions in impurity concentration, the ingots each have a resistivity distribution formed to decrease in resistivity from the inner peripheral side toward the outer peripheral side, and a resistivity distribution formed to decrease in resistivity from the top side toward the bottom side.

Moreover, when a plurality of wafers are cut out from the ingots that have such distributions in resistivity, the resistivity varies among the wafers, depending on the distributions in impurity concentration. When resonators are manufactured from these wafers, frequency temperature characteristics vary depending on the variation in resistivity among the wafers. However, conventionally, this variation in resistivity among wafers have not been addressed at all.

SUMMARY

The present disclosure provides a method for manufacturing a resonator that is capable of effectively addressing the variation in resistivity for each wafer.

A method for manufacturing a resonator according to an exemplary aspect includes the step of forming a Si oxide film at the surface of a degenerated Si wafer, where the Si oxide film has a thickness set in accordance with the doping amount of impurity in the Si wafer.

A method for manufacturing a resonator according to another exemplary aspect includes the step of forming a piezoelectric thin film on the surface of a degenerated Si wafer, where the piezoelectric thin film has a thickness set in accordance with the distribution of the doping amount of impurity in the Si wafer in an in-plane direction of thereof.

A wafer body according to an exemplary aspect includes a degenerated Si wafer; and a piezoelectric thin film formed on the surface of the Si wafer, where the piezoelectric thin film has a thickness set in accordance with the distribution of the doping amount of impurity in the Si wafer in an in-plane direction of thereof.

According to the present disclosure, a method for manufacturing a resonator can be provided that effectively addresses the variation in resistivity for each wafer.

DETAILED DESCRIPTION

Figure 1:
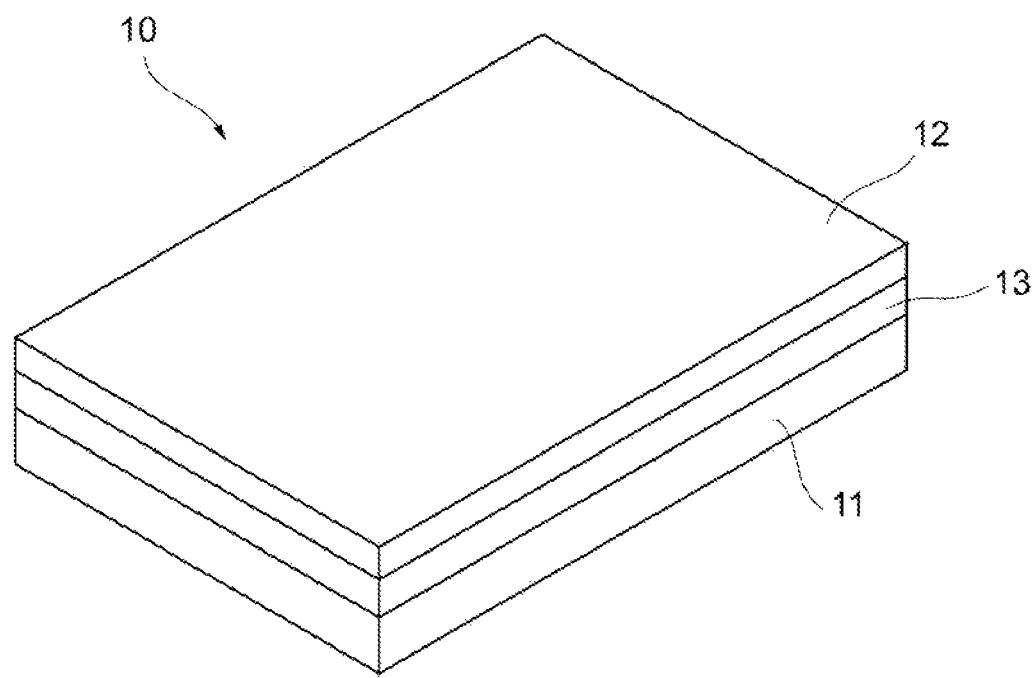
FIG. 1 is a perspective view schematically illustrating the appearance of a piezoelectric resonance device according to an exemplary aspect.

An embodiment of the present disclosure will be described below with reference to the accompanying drawings. FIG. 1 is a perspective view schematically illustrating the appearance of a piezoelectric resonance device 10 according to a specific example. As shown, the piezoelectric resonance device 10 includes a lower substrate 11, an upper substrate 12 that forms an oscillation space with the lower substrate 11, and a piezo-resonator 13 sandwiched between the lower substrate 11 and the upper substrate 12. In this example, the piezo-resonator 13 is a MEMS resonator manufactured by a MEMS technology that functions as, for example, a timing device incorporated in an electronic device such as a smartphone.

Figure 2:
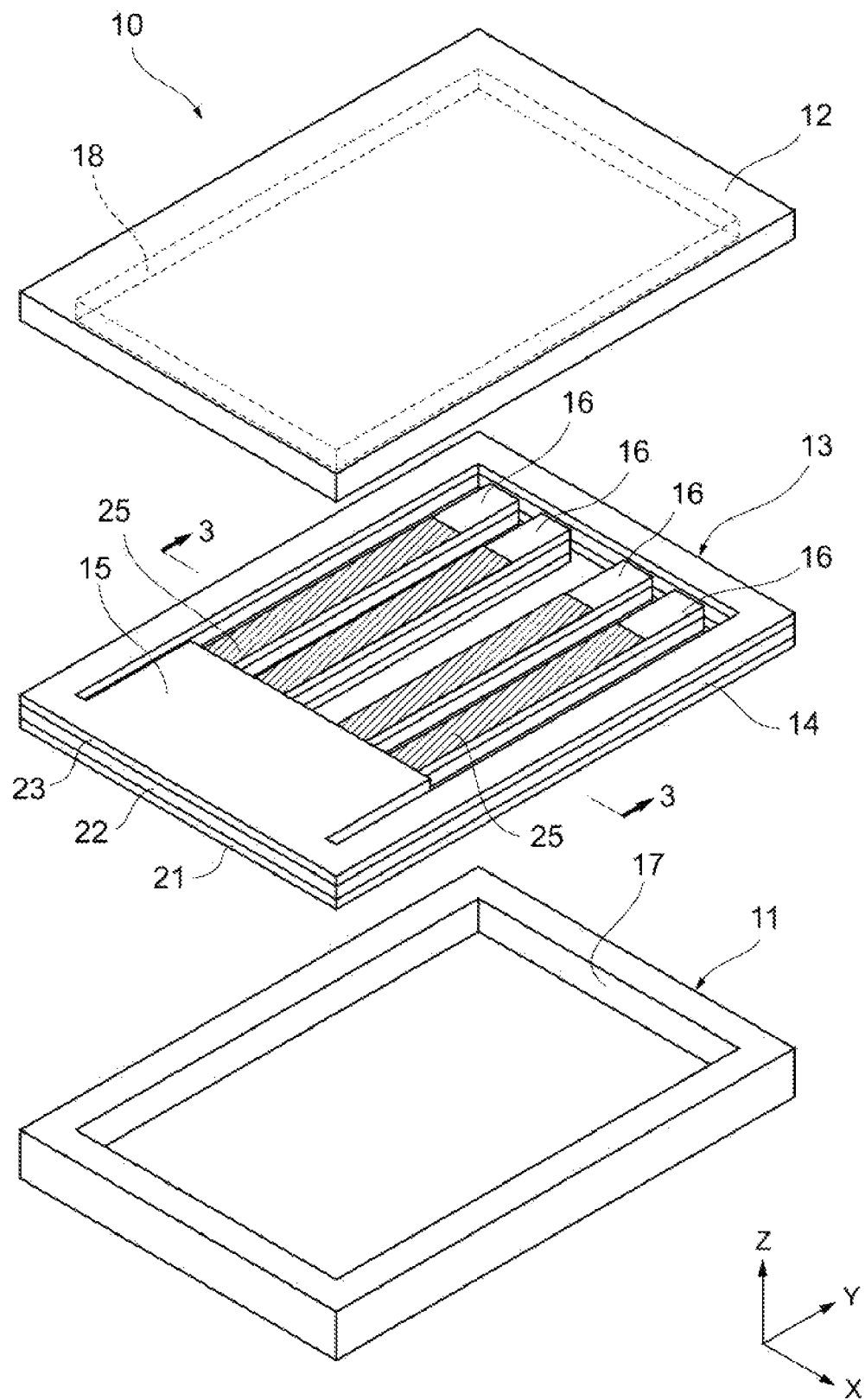
FIG. 2 is an exploded perspective view schematically illustrating the structure of a piezoelectric resonance device according to an exemplary aspect.

FIG. 2 is an exploded perspective view schematically illustrating the structure of a piezoelectric resonance device 10 according to a specific example. As shown in FIG. 2, the piezo-resonator 13 includes: a support frame 14 that spreads in the form of a rectangular frame along the XY plane in the orthogonal coordinate system in FIG. 2; a base 15 that spreads in the form of a flat plate along the XY plane in the support frame 14 from one end of the support frame 14; and a plurality of oscillation arms 16 that each extend along the XY plane from a fixed end connected to one end of the base 15 toward a free end. According to the present embodiment, the four oscillation arms 16 extend parallel to the Y axis. It is noted that the number of oscillation arms 16 is not limited to 4, and can be, for example, any number of 3 or more according to alternative aspects.

For the piezoelectric resonance device 10 according to an exemplary aspect, the lower substrate 11 spreads in the form of a plate along the XY plane, and the upper surface of the substrate has a depression 17 formed therein. The depression 17 formed in, for example, a flat cuboid shape forms a part of the oscillation space for the oscillation arms 16. On the other hand, the upper substrate 12 spreads in the form of a plate along the XY plane, and the lower surface of the substrate has a depression 18 formed therein. The depression 18 formed in, for example, a flat cuboid shape forms a part of the oscillation space for the oscillation arms 16. The lower substrate 11 and the upper substrate 12 are both formed from Si (silicon).

In this piezoelectric resonance device 10, the support frame 14 of the piezo-resonator 13 is received on a peripheral edge of the upper surface of the lower substrate 11, which is defined outside the depression 17, and a periphery of the lower surface of the upper substrate 12, which is defined outside the depression 18, is received on the support frame 14 of the piezo-resonator 13. In this way, the piezo-resonator 13 is held between the lower substrate 11 and the upper substrate 12, and the lower substrate 11, the upper substrate 12, and the support frame 14 of the piezo-resonator 13 form the oscillation space for the oscillation arms 16. This oscillation space is kept airtight, and the vacuum state is maintained.

Figure 3:
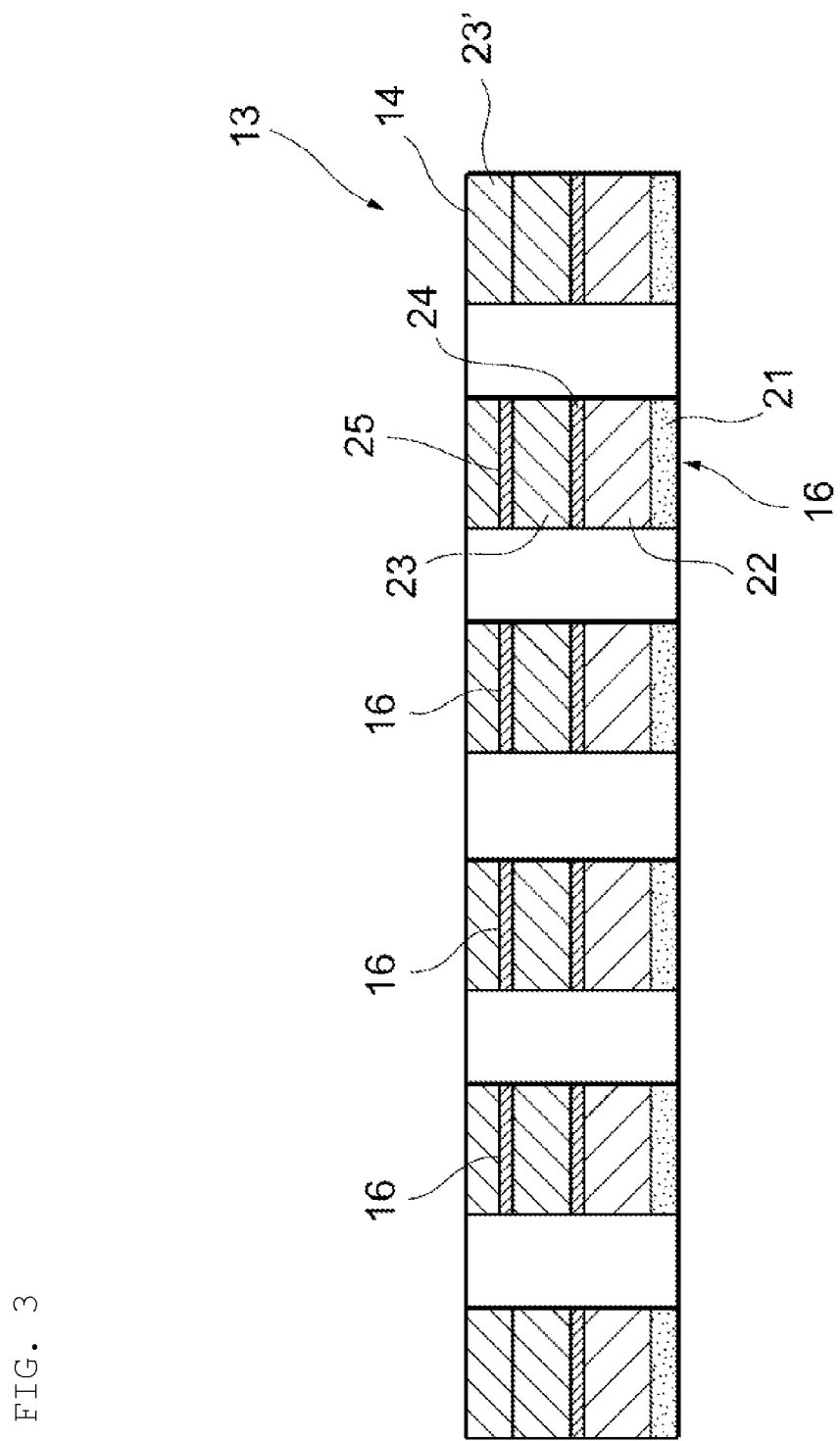
FIG. 3 is a pattern diagram of a cross section of the piezo-resonator along the line 3-3 of FIG. 2.

FIG. 3 is a pattern diagram of a cross section of the piezo-resonator 13 along the line 3-3 of FIG. 2.

Referring to FIG. 3 together, in the case of the piezo-resonator 13, the oscillation arms 16 each includes: a Si oxide film (thermal oxidation film), for example, a $SiO_2$ layer (silicon dioxide) 21; an active layer, that is, a Si layer 22 laminated on the $SiO_2$ layer 21; a piezoelectric thin film, that is, an AlN (aluminum nitride) layer 23 laminated on the Si layer 22; a lower electrode, that is, a Mo (molybdenum) layer 24 and an upper electrode, that is, a Mo layer 25 formed on the upper surface and lower surface of the AlN layer 23 to sandwich the AlN layer 23; and further, an AlN layer 23' laminated on the Mo layer 25. It is noted that the $SiO_2$ layer 21 may be formed between the Si layer 22 and the Mo layer 24, or on the upper surface of the Mo layer 25.

A silicon oxide material including any composition of $Si_aO_b$ layer (a and b are integers) is used for the Si oxide film. The active layer formed from a degenerated n-type Si semiconductor contains, as an impurity, that is, an n-type dopant, a Group 15 element such as P (phosphorus), As (arsenic), and Sb (antimony). It is noted that two or more of P, As, and Sb may be mixed in the active layer. Furthermore, Ge (germanium) that has a larger ionic radius than the ionic radius of Si may be added to the active layer to control lattice distortion due to impurity doping in large amounts. According to the present embodiment, the Si layer 22 is doped with a predetermined doping amount of P (phosphorus) as an n-type dopant.

The AlN layer 23 is a piezoelectric thin film that converts an applied voltage to oscillations. In place of the AlN layer 23, for example, a ScAlN (scandium-containing aluminum nitride) layer may be used for the piezoelectric thin film. In addition, in place of the AlN layer 23, a MgNbAlN (magnesium-niobium-containing aluminum nitride) layer, a MgZrAlN (magnesium-zirconium-containing aluminum nitride) layer, BAlN (boron-containing aluminum nitride), and GeAlN (germanium-containing aluminum nitride) may be used for the piezoelectric thin film. Furthermore, a GaN (gallium nitride) layer, an InN (indium nitride) layer, a ZnO (zinc oxide) layer, a PZT (lead zirconate titanate) layer, a KNN (potassium sodium niobate) layer, a $LiTaO_3$ (lithium tantalate) layer, and a $LiNbO_3$ (lithium niobate) layer may be used for the piezoelectric thin film.

In place of the Mo layers 24, 25, for example, a metal material such as Ru (ruthenium), Pt (platinum), Ti (titanium), Cr (chromium), Al (aluminum), Cu (copper), Ag (silver) or an alloy thereof is used for the lower electrode and the upper electrode. The Mo layer 24 and the Mo layer 25 are each connected to an alternating-current power supply (not shown) provided outside the piezoelectric resonance device 10. For the connection, for example, an electrode (not shown) formed on the upper surface of the upper substrate 12, a through silicon via (TSV) (not shown) formed in the lower substrate 11 or the upper substrate 12, or the like is used.

The AlN layer 23' is, for example, a film for protecting the Mo layer 25. It is noted that the layer formed on the Mo layer 25 is not limited to the AlN layer, but may be, for example, a film formed from an insulator.

The AlN layer 23 has a wurtzite structure, which is C-axis oriented substantially perpendicular to the Si layer 22. When a voltage is applied in the C-axis direction through the Mo layer 24 and the Mo layer 25, the AlN layer 23 is stretched in a direction substantially perpendicular to the C axis. With this stretching, the oscillation arms 16 undergo flexural displacement in the Z-axis direction to cause free ends thereof to undergo displacement toward the inner surfaces of the lower substrate 11 and the upper substrate 12, thereby oscillating in an out-of-plane flexural oscillation mode.

According to the present embodiment, the thicknesses of the Si oxide film and piezoelectric thin film are controlled in accordance with the doping amount of a dopant, that is, an impurity formed in an ingot in the manufacture of the ingot used for the manufacture of the piezo-resonator 13, and the distribution of the doping amount. The control of the thicknesses of the Si oxide film and piezoelectric thin film can reduce variations in frequency-temperature characteristics of the piezo-resonator 13. Accordingly, as will be described below, the piezo-resonator 13 according to an exemplary aspect, that is, the piezoelectric resonance device 10, can be provided which has favorable temperature characteristics.

Next, a method for setting the thicknesses of the Si oxide film and piezoelectric thin film will be described. Prior to the manufacture of the piezoelectric resonance device 10, ingots in a substantially cylindrical shape are manufactured by, for example, a CZ method (Czochralski method). For each ingot, the doping amount of an impurity, for example, such as P is set to a predetermined setting. However, the ingots manufactured each have a tendency to have a higher impurity concentration at the outer peripheral side in a radial direction of the ingot than at the inner peripheral side therein, and have a higher impurity concentration at the bottom side in a lifting direction of the ingot than the top side therein. In this way, the distribution of the impurity concentration is produced in the ingots.

This distribution of the impurity concentration roughly agrees with the distribution of resistivity. Specifically, in accordance with the distribution of the impurity concentration in the lifting direction, the ingots each have such a resistivity distribution as a decrease in resistivity from the top side toward the bottom side. This resistivity distribution in the lifting direction can be specified by measuring the impurity concentration at a plurality of points in the ingot manufactured. For example, the resistivity distribution can be specified by measuring the impurity concentration through SIMS (secondary ion mass spectrometry) at a plurality of points at the bottom surface of a cylindrical block of ingot with ends removed from the ingot manufactured, and measuring the impurity concentration in the same way at a plurality of points at the upper surface of the cylindrical block. Alternatively, the resistivity may be actually measured at these points. The resistivity can be measured by, for example, a four probe method.

In addition, in accordance with the distribution of the impurity concentration in the radial direction of the ingot, the ingots each have such a resistivity distribution as a decrease in resistivity from the inner peripheral side toward the outer peripheral side. This resistivity distribution in the radial direction can be specified by measuring the impurity concentration at a plurality of points in the radial direction at the bottom surface and upper surface of the cylindrical block of ingot, and in consideration of the distribution of the impurity concentration in the lifting direction, calculating the distribution of the impurity concentration in the radial direction in each position in the lifting direction of the ingot.

Prior to the manufacture of the piezo-resonator 13, a plurality of Si wafers are cut out from the cylindrical block of the ingot. Each Si wafer has an impurity concentration, that is, a resistivity in accordance with the location in the lifting direction in the ingot, and the wafers are sorted into respective lots grouped for each predetermined resistivity range. This operation of sorting into the lots is repeated for each ingot, thereby collecting, for each lot, a plurality of Si wafers with resistivity in a predetermined range, which are cut from a plurality of ingots. In this regard, the resistivity of the Si wafer as a criterion for sorting into the lots is specified on the basis of the average value for the doping amount of impurity (average value for resistivity) in the in-plane direction of the Si wafer.

Figure 4:
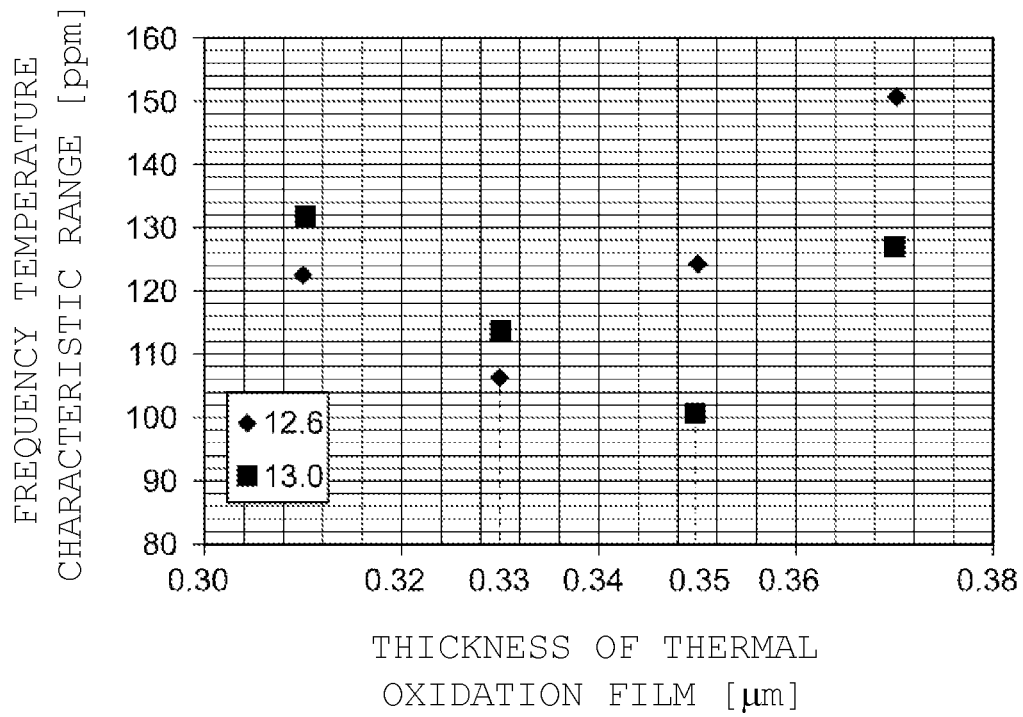
FIG. 4 is a graph showing the relationship between the thickness of a Si oxide film and the frequency-temperature characteristic range of a piezo-resonator.

The thickness of the Si oxide film, that is, the $SiO_2$ layer 21 formed at the Si wafer is controlled, for example, in each lot unit. Thus, the frequency-temperature characteristic range of the piezo-resonator 13 can be controlled appropriately in accordance with the distribution of the doping amount of impurity (resistivity) in the ingot in the lifting direction. FIG. 4 is a graph showing the relationship between the thickness of the Si oxide film and the frequency-temperature characteristic range of the piezo-resonator 13. The frequency-temperature characteristic range [ppm] refers to a value indicating a difference, that is, a magnitude of change between the maximum value and minimum value of the frequency in the operation temperature range (for example, −40° C. to 85° C.) of the piezoelectric resonator 13. As this frequency-temperature characteristic range is smaller, the variation in frequency-temperature characteristics is reduced.

As is clear from FIG. 4, for example, when the doping amount of impurity in the Si wafer has an average value of $12.6 \times 10^{19}$ atm/cm$^3$, setting the thickness of the Si oxide film to 0.33 μm causes the frequency-temperature characteristic range to reach a minimum value. In addition, for example, when the doping amount of impurity in the Si wafer has an average value of $13.0 \times 10^{19}$ atm/cm$^3$, setting the thickness of the Si oxide film to 0.35 μm causes the frequency-temperature characteristic range to reach a minimum value. In this way, the variation in frequency-temperature characteristics is reduced by setting the thickness of the Si oxide film to a thickness that causes the frequency-temperature characteristic range to reach a minimum value.

Figure 5:
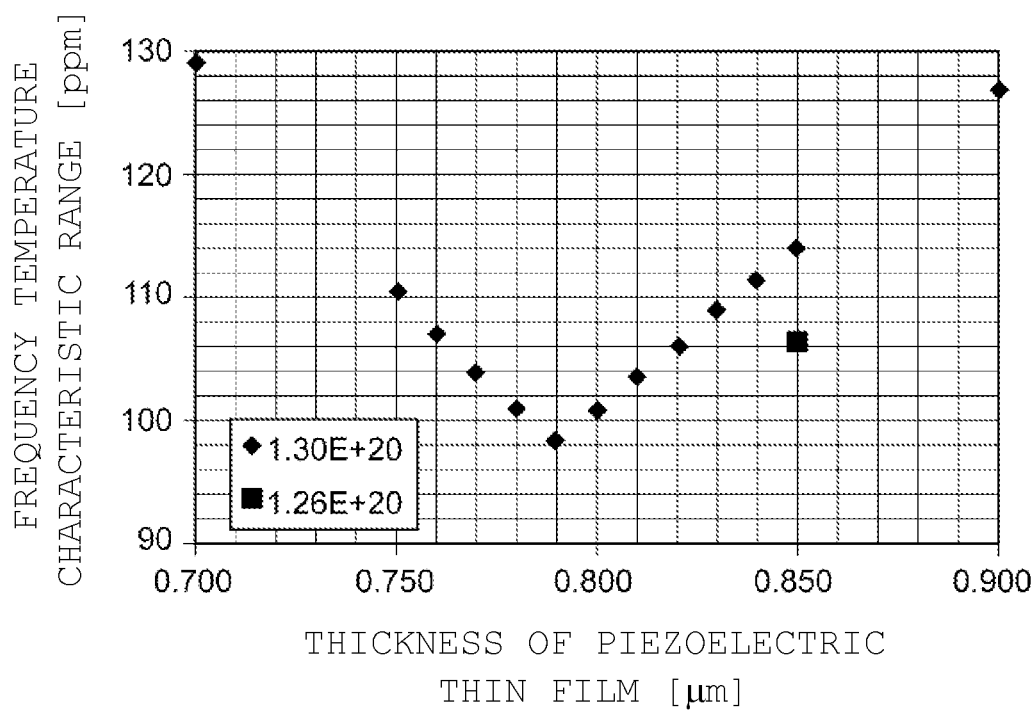
FIG. 5 is a graph showing the relationship between the thickness of a piezoelectric thin film and the frequency-temperature characteristic range of a piezo-resonator.

In addition, in place of the thickness of the Si oxide film, that is, the $SiO_2$ layer 21, or in addition to the thickness of the $SiO_2$ layer 21, the thickness of the piezoelectric thin film that is, the AlN film 23 may be controlled. For example, as in the case of the $SiO_2$ layer 21, the thickness of the AlN film 23 is controlled in each lot unit. Thus, the frequency-temperature characteristic range of the piezo-resonator 13 can be controlled appropriately in accordance with the distribution of the doping amount of impurity (resistivity) in the ingot in a radial direction. FIG. 5 is a graph showing the relationship between the thickness of the piezoelectric thin film and the frequency-temperature characteristic range of the piezo-resonator 13. As in the case described previously, the frequency-temperature characteristic range [ppm] refers to a value indicating a difference, that is, a magnitude of change between the maximum value and minimum value of the frequency in the operation temperature range (for example, −40° C. to 85° C.) of the piezoelectric resonator 13.

For example, a case is assumed where the doping amount of impurity is $1.26 \times 10^{20}$ atm/cm$^3$ near the center of the Si wafer, whereas the doping amount of impurity is $1.30 \times 10^{20}$ atm/cm$^3$ near the outer periphery of the Si wafer. In this case, as is clear from FIG. 5, near the center of the Si wafer, the thickness of the piezoelectric thin film is set to 0.850 μm with which the frequency-temperature characteristic range reaches a minimum value. In addition, near the outer periphery of the Si wafer, the thickness of the piezoelectric thin film is set to 0.790 μm with which the frequency-temperature characteristic range reaches a minimum value.

As described above, the distribution of the doping amount of impurity is formed in the in-plane direction of the Si wafer, and the thickness distribution is thus set in the radial direction in the case of the AlN film 23 in accordance with the distribution of the doping amount, formed in the radial direction from the inner peripheral side of the Si wafer toward the outer peripheral side thereof, for example. This thickness distribution of the piezoelectric thin film in the radial direction is set so as to achieve a thickness distribution in which the frequency-temperature characteristic range reaches a minimum value, thereby reducing the variation in frequency-temperature characteristics.

Figure 6:
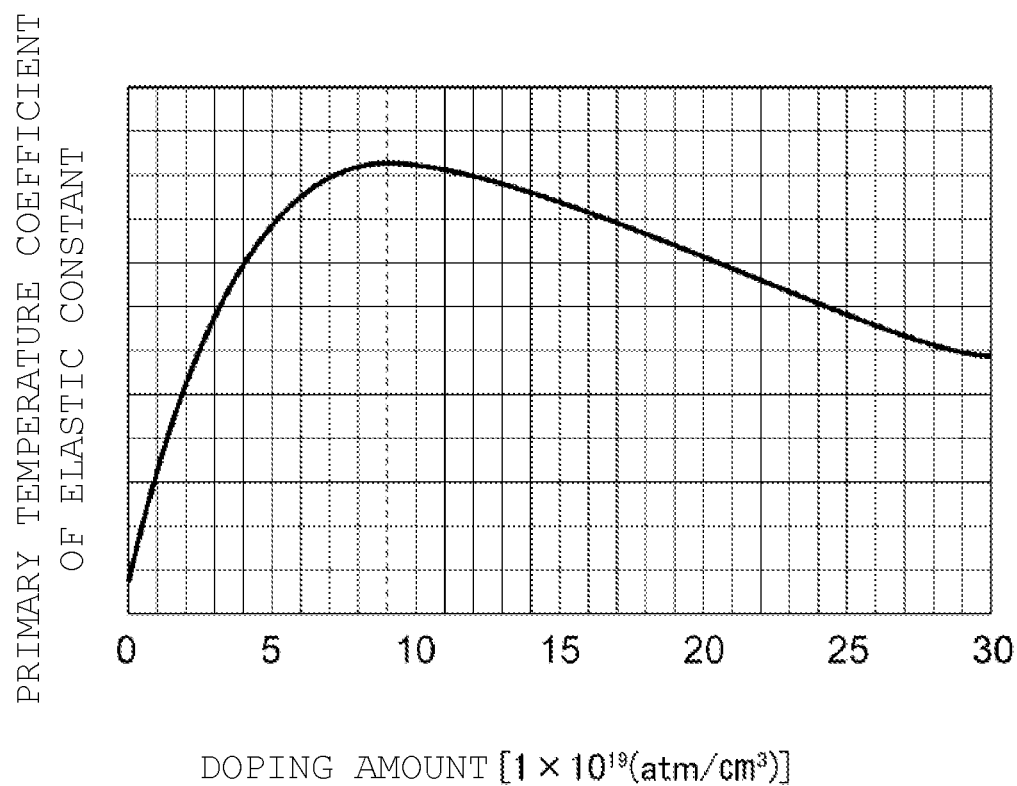
FIG. 6 is a graph showing the relationship between the doping amount of impurity and the primary temperature coefficient of elastic constant of a piezo-resonator.

FIG. 6 is a graph showing the relationship between the doping amount of impurity and the primary temperature coefficient of elastic constant of the piezo-resonator 13. As is clear from FIG. 6, the frequency-temperature characteristics increase in a relatively rapid manner up to approximately $9 \times 10^{19}$ atm/cm$^3$ as the doping amount of impurity in the Si wafer is increased from 0, while the frequency-temperature characteristics decrease in relatively gradual manner when the doping amount of impurity exceeds approximately $9 \times 10^{19}$ atm/cm$^3$.

Therefore, in order to address the distribution of the doping amount (resistivity) in the in-plane direction of the Si wafer, for example, a material such as AlN or ScAlN that has a negative primary temperature coefficient of elastic constant is used as the piezoelectric thin film, and when the doping amount in the Si wafer is more than approximately $9 \times 10^{19}$ atm/cm$^3$, the thickness of the piezoelectric thin film is increased at the outer peripheral side of the Si wafer, rather than at the inner peripheral side thereof. On the other hand, in the case of the doping amount below approximately $9 \times 10^{19}$ atm/cm$^3$, the thickness of the piezoelectric thin film is decreased at the outer peripheral side of the Si wafer, rather than at the inner peripheral side thereof. More specifically, it is preferable to control the thickness distribution of the piezoelectric thin film, with the doping amount of approximately $9 \times 10^{19}$ atm/cm$^3$ as a threshold value.

It is noted that the distribution of the doping amount (resistivity) in the in-plane direction of the Si wafer can be also addressed by control of the thickness distribution of the thin film (resonator-constituting thin film) constituting the piezo-resonator 13 formed above the Si layer 22, in place of the control of the thickness distribution of the piezoelectric thin film. Examples of the resonator-constituting thin film include, for example, the lower electrode 24 and the upper electrode 25. Besides, the distribution of the doping amount (resistivity) in the in-plane direction of the Si wafer can be also addressed by control of the distribution of, for example, the thickness of a parasitic capacitance-reducing (for example, silicon oxide) layer formed between the lower electrode 24 and the Si layer 22, or the thickness of an additional thin film layer such as a protective film layer of, for example, a silicon oxide layer or an AlN layer formed on the upper electrode 25.

For the foregoing resonator-constituting thin film, in the case of using, as the resonator-constituting thin film, a material such as, for example, AlN, Mo, Al, Pt, Ru, Ir (iridium), Ti, ScAlN, or SiN (silicon nitride) that has a negative primary temperature coefficient of elastic constant, it is preferable to control the thickness distribution of the resonator-constituting thin film, with the doping amount of approximately $9 \times 10^{19}$ atm/cm$^3$ as a threshold value in the same way as described previously. The distribution of the thickness in the in-plane direction of the Si wafer is controlled in the same way as described previously. It is noted that in the case of, for example, a material that has a positive primary temperature coefficient of elastic constant, such as SiO$_2$ or SiOF (fluorine-containing silicon oxide film), it is preferable to set the thickness in an opposite manner to the foregoing in the in-plane direction of the Si wafer, with the above-mentioned threshold voltage as a boundary.

Figure 7A:
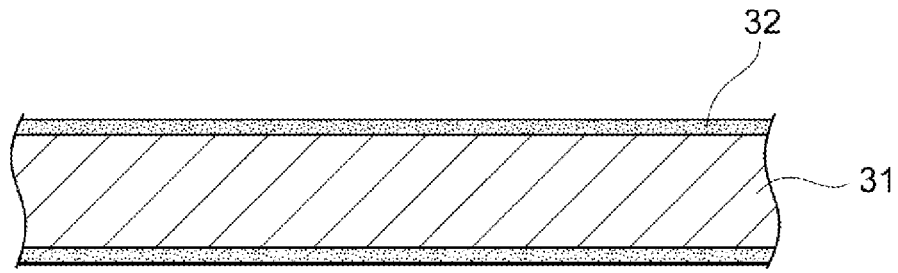
FIGS. 7(a) to 7(c) are each a pattern diagram of a cross section illustrating a method for manufacturing a piezoelectric resonance device according to an exemplary aspect.
Figure 7B:
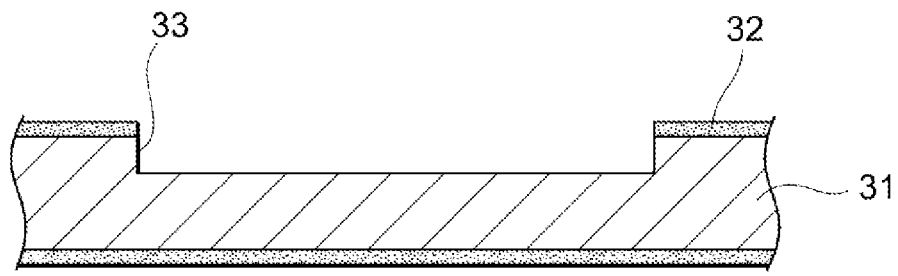
Figure 7C:
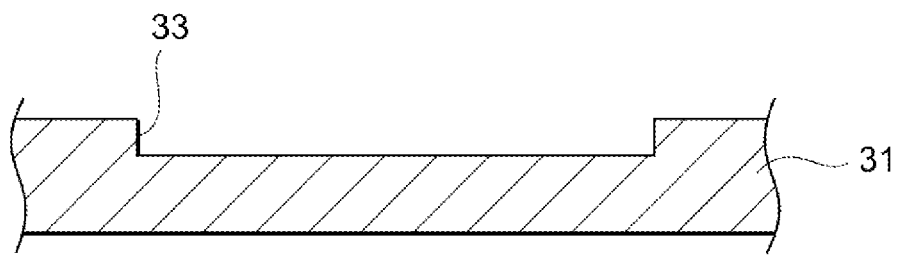

Next, a method for manufacturing the piezoelectric resonance device 10 will be schematically described below. FIGS. 7(a) to 7(c) are each a cross-sectional view for explaining a method for manufacturing the piezoelectric resonance device 10 according to an exemplary aspect. It is noted that while a plurality of zones corresponding to respective piezoelectric resonance devices 10 are defined on a Si wafer, only one zone on the Si wafer is illustrated in the figures for the following explanation of the manufacturing method. In addition, the thicknesses of the Si oxide film and piezoelectric thin film are controlled for each lot of a plurality of collected Si wafers with a predetermined range of resistivity.

First, as shown in FIG. 7(a), for the manufacture of the lower substrate 11, a plate-like wafer 31 formed from Si is prepared, and the entire surface of the wafer 31 is subjected to a thermal oxidation treatment, thereby forming a Si oxide film (for example, SiO$_2$) 32 with a predetermined thickness over the entire surface of the wafer 31. As shown in FIG. 7(b), in the surface of the wafer 31, a depression 33 is formed by, for example, etching. Thereafter, as shown in FIG. 7(c), the wafer 31 is cleaned after removing the Si oxide film 32. In this way, the lower substrate 11 with the depression 17 in the upper surface thereof is formed.

Figure 8A:
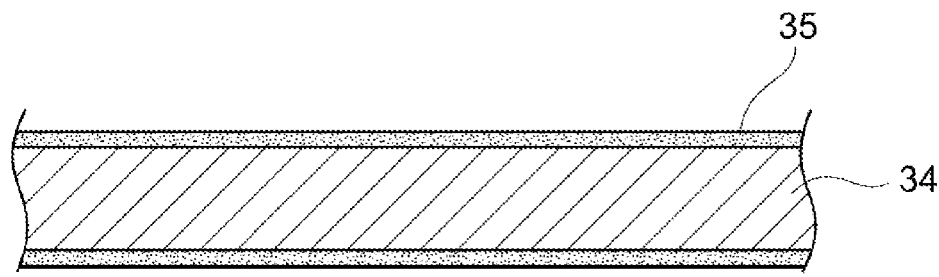
FIGS. 8(a) to 8(c) are each a pattern diagram of a cross section illustrating a method for manufacturing a piezoelectric resonance device according to an exemplary aspect.

On the other hand, as shown in FIG. 8(a), for the manufacture of the piezo-resonator 13, a degenerated Si wafer 34 is prepared. The Si wafer 34 is doped with an impurity in a predetermined doping amount, the actual doping amount (resistivity) of the Si wafer 34 is specified in advance. The entire surface of the Si wafer 34 is subjected to a thermal oxidation treatment, thereby forming a Si oxide film (for example, SiO$_2$) 35 with a predetermined thickness. It is noted that besides thermal oxidation films, TEOS oxidation films, PECVD oxidation films, and sputtered oxidation films can be used for the Si oxide film 35. The thickness of the Si oxide film is set in accordance with the average value for the actual doping amount (resistivity) in the in-plane direction of the Si wafer 34 as described above.

Figure 8B:
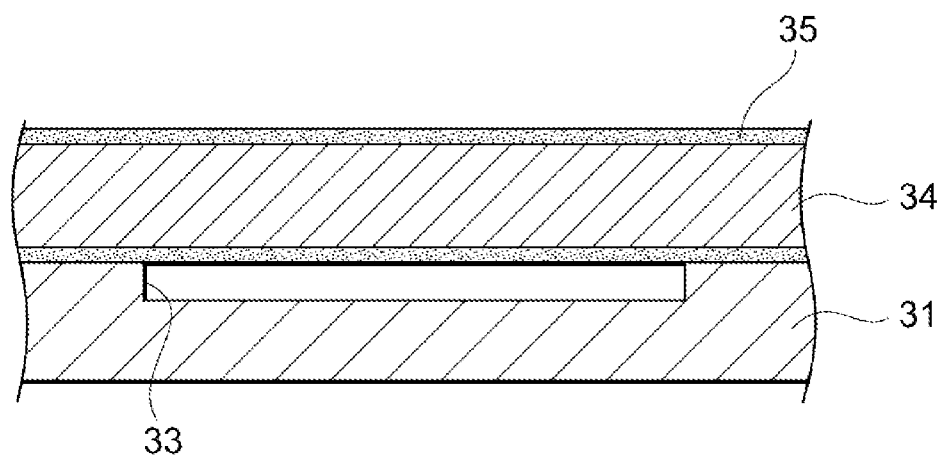
Figure 8C:
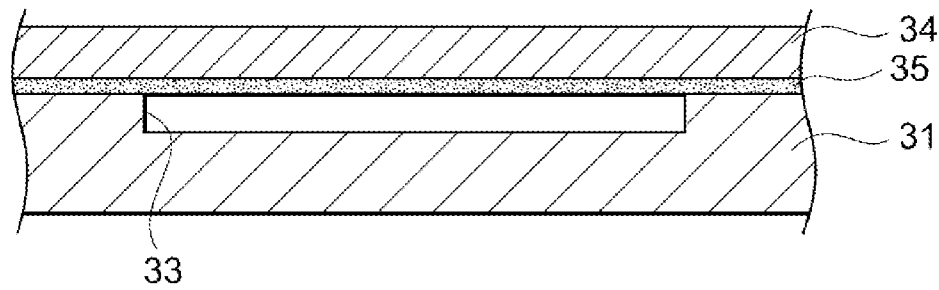

Thereafter, as shown in FIG. 8(b), the lower surface of the Si wafer 34 is put on the upper surface of the wafer 31 described previously, thereby joining the Si wafer 34 to the upper surface of the wafer 31. For the joining, for example, fusion joining is carried out. Subsequently, as shown in FIG. 8(c), the upper surface of the Si wafer 34 is subjected to a grinding treatment and a polishing treatment (CMP: chemical mechanical polishing), thereby grinding and removing the Si oxide film 35 at the upper surface of the Si wafer 34 and a part of the Si wafer 34, and thus planarizing the surface of the Si wafer 34. In this way, a so-called Cavity SOI is manufactured.

Figure 9A:
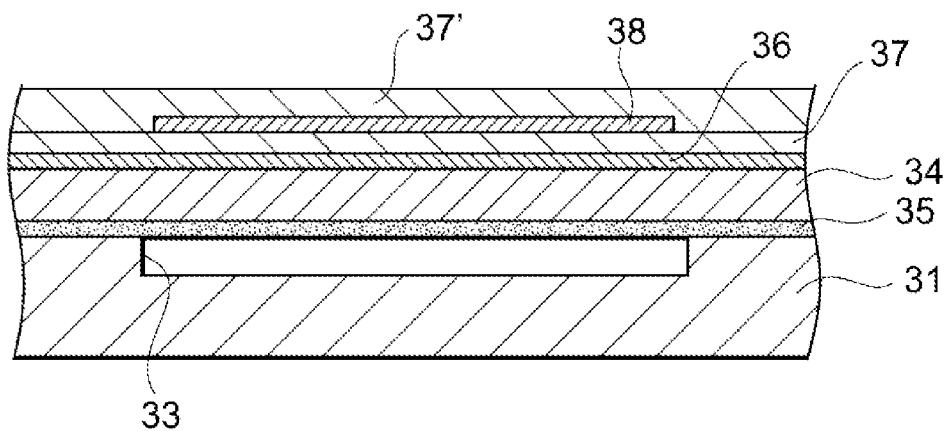
FIGS. 9(a) and 9(b) are each a pattern diagram of a cross section illustrating a method for manufacturing a piezoelectric resonance device according to an exemplary aspect.

Thereafter, as shown in FIG. 9(a), on the Si wafer 34, a lower electrode film (for example, Mo) 36, a piezoelectric thin film (for example, AlN) 37, an upper electrode film (for example, Mo) 38, and a piezoelectric thin film 37' are sequentially deposited by, for example, sputtering. In this regard, the thickness of the piezoelectric thin film 37 is set in accordance with the distribution of the doping amount of impurity (resistivity) in the in-plane direction of the Si wafer 34 as described above. For example, the thickness of the piezoelectric thin film 37 has a distribution in the in-plane direction such that the thickness of the piezoelectric thin film 37 is decreased from near the center of the Si wafer 34 toward the outer periphery. In this way, a wafer body is manufactured which includes the piezoelectric thin film 37 with a thickness set in accordance with the distribution of the doping amount (resistivity) in the in-plane direction of the Si wafer 34.

In this regard, for the formation of the piezoelectric thin film 37, for example, an Al target (not shown) is disposed to be opposed to the upper surface of the Si wafer 34. A magnet (not shown) is disposed behind the Al target to confine electrons in a magnetic field, thereby accelerating ionization of an inert gas such as Ar (argon), and thus generating a high concentration of plasma around the Al target. As a result, the piezoelectric thin film 37 can be deposited at high speed. Accordingly, the distribution of sputtered particles that reach the upper surface of the Si wafer 34 depends largely on the distribution of the magnetic field formed by the magnet. In other words, controlling the distribution of the magnetic field allows the thickness of the piezoelectric thin film 37 to have a distribution.

Accordingly, for example, the location of the magnet or the rotation speed of the Si wafer 34 is adjusted to control the magnetic field intensity of the magnet, thereby allowing the thickness of the piezoelectric thin film 37 to have a distribution in the in-plane direction. Alternatively, in place of this method, it is also possible to measure the thickness of the piezoelectric thin film 37 actually after forming the piezoelectric thin film 37 with a uniform thickness on the upper surface of the Si wafer 34, and chip away the piezoelectric thin film 37 with Ar ion beams or the like so as to achieve a desired distribution in thickness, thereby causing the piezoelectric thin film 37 to have a distribution in thickness. According to this method, the thickness of the piezoelectric thin film 37 can be controlled in a more precise manner.

Figure 9B:
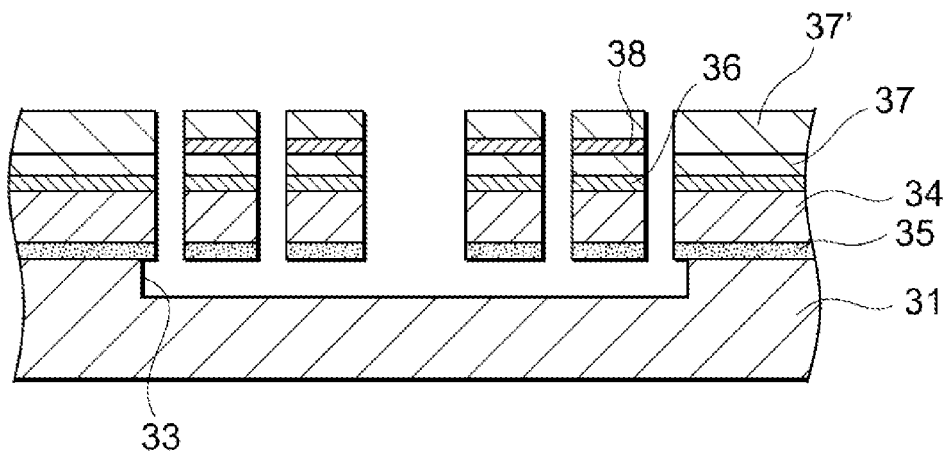

Subsequently, as shown in FIG. 9(*b*), the Si wafer 34, the Si oxide film 35, the lower electrode film 36, the piezoelectric thin film 37, the upper electrode film 38, and the piezoelectric thin film 37' are subjected to, for example, dry etching or wet etching, thereby forming the shapes of the support frame 14, base 15, and oscillation arms 16 described above. In this way, the piezo-resonator 13 is formed which is supported by the support frame 14 on the upper surface of the lower substrate 11. Thereafter, a wafer (not shown) that has depressions formed in advance in zones corresponding to the respective zones of the Si wafer 34 is joined onto the piezo-resonator 13. Subsequently, respective piezoelectric resonance devices 10 are cut out along the outlines of the respective zones, for example, with a diamond blade or by a laser dicing method.

It is noted that while the both thicknesses of the Si oxide film 35 and piezoelectric thin film 37 are controlled in accordance with the doping amount of impurity (resistivity) in the degenerated Si wafer 34 and the distribution thereof according to the above-described method for manufacturing the piezoelectric resonance device 10, the exemplary embodiments are not to be considered limited thereto, but for example, the thickness of only either the Si oxide film 35 or the piezoelectric thin film 37 may be controlled. Preferably, the piezoelectric resonance device 10 which varies little in frequency-temperature coefficient can be provided even by controlling the thickness of only either the Si oxide film 35 or the piezoelectric thin film 37 in this way as just described.

Moreover, a method where a Si wafer is sorted into a lot on the basis of the average value for the doping amount of impurity in the in-plane direction of the Si wafer, and the thickness of the $SiO_2$ layer 21 formed at the Si wafer is controlled in each lot unit has been described as an example in accordance with the above-described method for manufacturing the piezoelectric resonance device 10. However, the exemplary embodiment should not be limited thereto and it is also possible to further control the thickness of the $SiO_2$ layer 21 in accordance with the distribution of the doping amount of impurity in the in-plane direction of the Si wafer.

Specifically, in the step shown in FIG. 8(*a*), the film thickness of the Si oxide film 35 is controlled after forming the Si oxide film 35 with a predetermined thickness over the entire surface of the Si wafer 34. Prior to the control of the film thickness of the Si oxide film 35, first, the in-plane resistivity distribution of the Si wafer 34 is specified.

It is possible to specify the in-plane resistivity distribution of the Si wafer 34, for example, on the basis of the distribution of the resistivity in a radial direction of an ingot. Specifically, the distribution of the resistivity in the radial direction of the ingot can be specified by calculating the distribution of the impurity concentration in the radial direction in each location in the lifting direction of the ingot as described above.

Next, the film thickness distribution of the Si oxide film 35 is measured in plane with the Si wafer 34. Then, the film thickness of the Si oxide film 35 is controlled by trimming on the basis of the specified resistivity distribution and film thickness distribution, such that the piezo-resonator 13 has uniform frequency-temperature characteristics in plane with the Si wafer 34.

Figure 10:
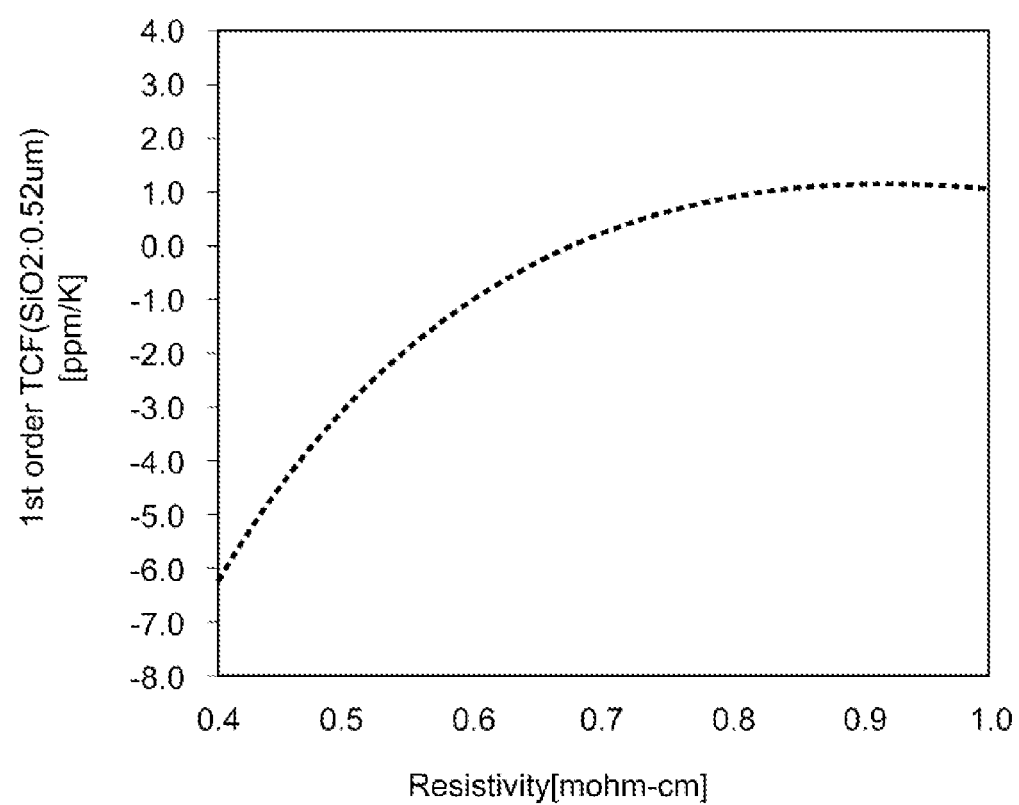
FIG. 10 is a graph showing the relationship between the resistivity of a wafer and the frequency-temperature characteristic range of a piezo-resonator.

FIG. 10 is a diagram showing the relationship between the resistivity of a wafer and the frequency-temperature characteristics of the piezo-resonator 13. In FIG. 10, the horizontal axis indicates the resistivity of a wafer, whereas the vertical axis indicates a primary coefficient term of frequency-temperature characteristics. From FIG. 10, it is determined that as the resistivity of the wafer is increased, the frequency-temperature characteristics have a larger value, and approach asymptotically to around 2.0 ppm/K. Accordingly, from the relationship between the frequency-temperature characteristics and the resistivity, and the relationship between the frequency-temperature characteristic and the thickness of the Si oxide film as shown in FIG. 4, it is determined that for example, in the case of a wafer of 0.5 mΩcm in average resistivity, the variation in frequency-temperature characteristics can be reduced by controlling the film thickness so as to make the Si oxide film 35 thinner, in a region where the resistivity is high in plane with the wafer.

For example, local etching with the use of, for example, a rare gas, for example, Ar (argon) ion beams, or a chemical reaction gas, for example, $SF_6$ (sulfur hexafluoride) gas plasma, or local etching of spraying a hydrofluoric acid solution from a thin nozzle to the Si wafer can be used for trimming the film thickness of the Si oxide film 35.

This local etching makes it possible to reduce the variation in frequency-temperature characteristics on the basis of the resistivity in plane with the Si wafer.

Figure 11A:
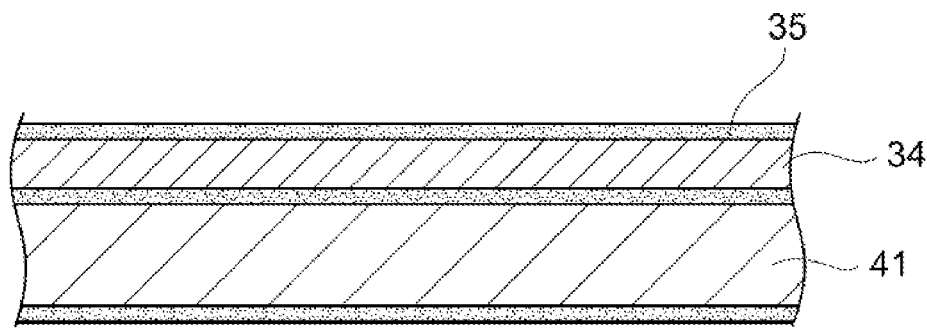
FIGS. 11(a) to 11(c) are each a pattern diagram of a cross section illustrating a method for manufacturing a piezoelectric resonance device according to an exemplary aspect.
Figure 11B:
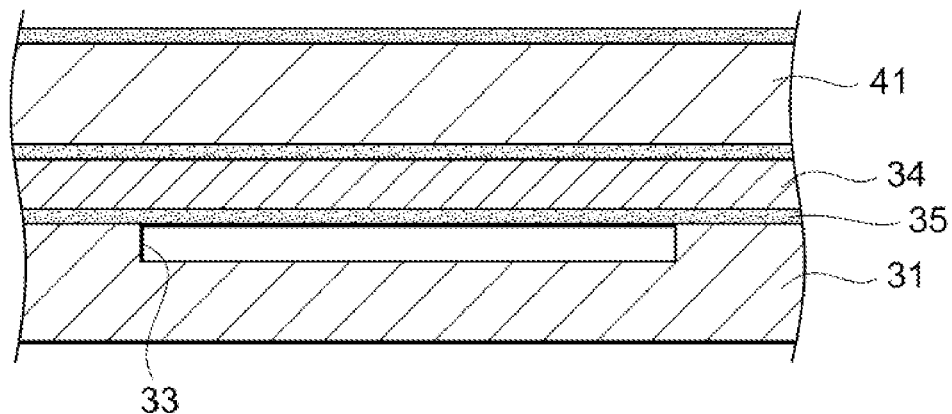
Figure 11C:
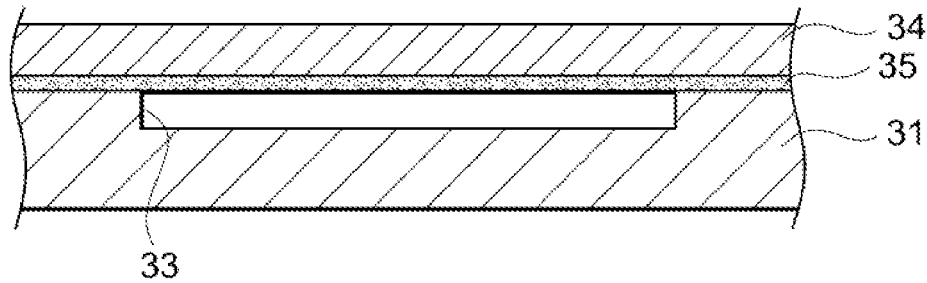

In addition, the manufacturing method described below may be implemented in place of the method for manufacturing a Cavity SOI as described above. For example, as shown in FIG. 11(*a*), the entire surface of the degenerated Si wafer 34 described previously is subjected to a thermal oxidation treatment, thereby forming the Si oxide film 35 with a predetermined thickness. A handle wafer 41 of Si is joined to the lower surface of the Si wafer 34. On the other hand, a wafer 31 with a depression 33 is formed in the same way as described previously. Thereafter, as shown in FIG. 11(*b*), the upper surface of the Si wafer 34 is bonded to the upper surface of the wafer 31 with the depression 33 by, for example, fusion joining.

After joining the wafer 31 and the Si wafer 34, the handle wafer 41 is removed from the upper surface of the Si wafer 34. Thereafter, as shown in FIG. 11(*c*), the Si oxide film 25 at the upper surface of the Si wafer 34 is removed by wet etching.

Thereafter, in the same way as described previously, a lower electrode film (for example, Mo) 36, a piezoelectric thin film (for example, AlN) 37, and an upper electrode film (for example, Mo) 38 are sequentially deposited on the upper surface of the Si wafer 34, for example, by sputtering, thereby manufacturing a piezoelectric resonance device 10.

Figure 12:
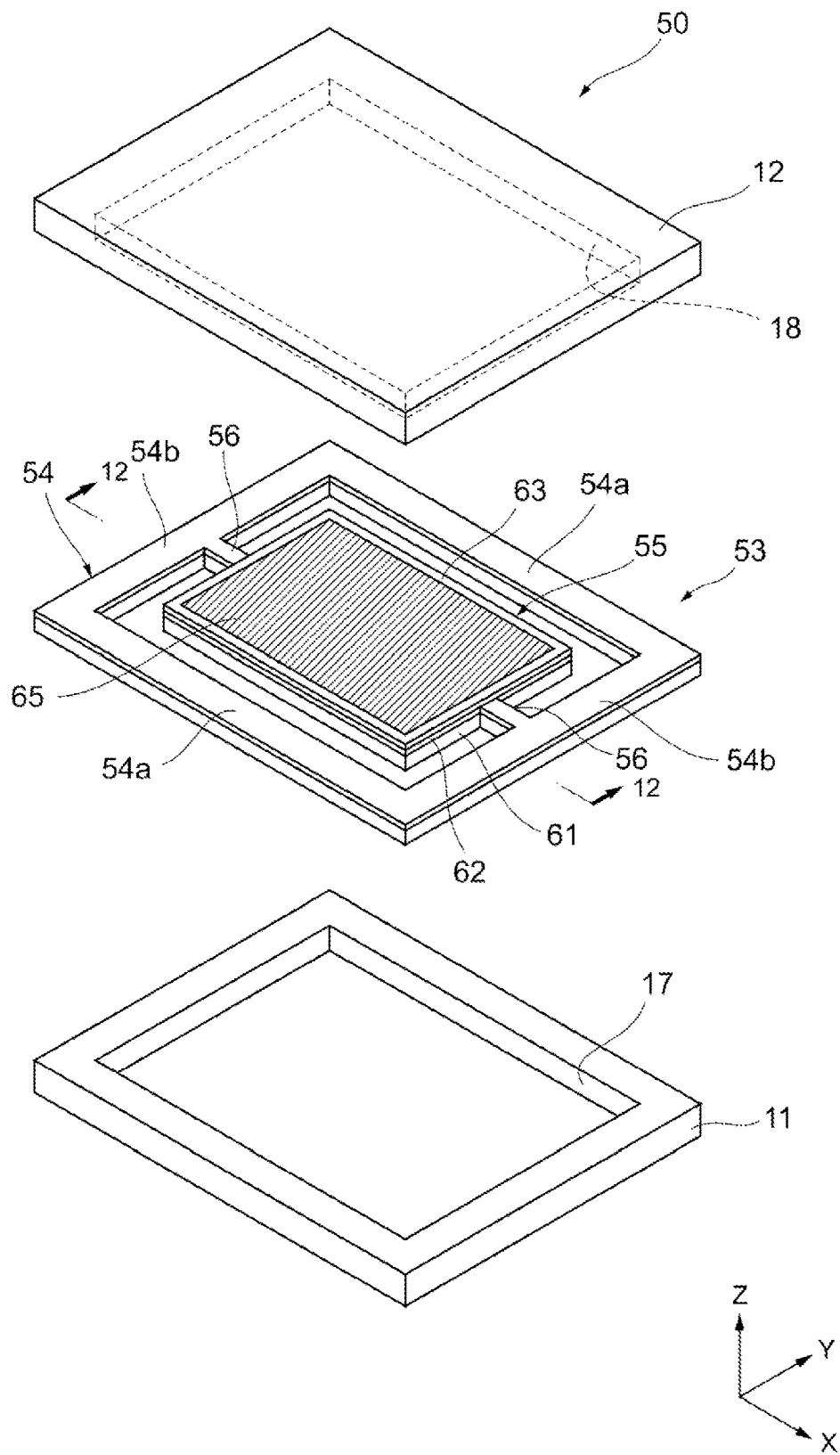
FIG. 12 is an exploded perspective view schematically illustrating the structure of a piezoelectric resonance device according to another exemplary aspect.

FIG. 12 is an exploded perspective view schematically illustrating a structure that represents the appearance of a piezoelectric resonance device 50 according to another exemplary aspect. This piezoelectric resonance device 50 includes a piezo-resonator 53 which oscillates in an in-plane spread oscillation mode, in place of the piezo-resonator 13 which oscillates in a flexural oscillation mode as described previously. The piezo-resonator 53 is sandwiched between a lower substrate 11 and an upper substrate 12, as in the case of the piezo-resonator 13 described previously. The lower substrate 11 and the upper substrate 12 have the same configurations as the structures described previously, and the repeated explanations will be thus left out.

The piezo-resonator 53 includes: a support frame 54 that spreads in the form of a rectangular frame along the XY plane in the orthogonal coordinate system in FIG. 12; an oscillation part 55 disposed inside the support frame 54 to spread in a rectangular form along the XY plane as in the case of the support frame 54; and a pair of connection parts 56, 56 connecting the support frame 54 and the oscillation part 55 to each other. The oscillation part 55 oscillates by repeated stretching in the Y-axis direction along the XY plane, as will be described later.

The support frame 54 includes: a pair of longer frame parts 54a, 54a extending parallel to the X axis; and a pair of shorter frame parts 54b, 54b extending parallel to the Y axis, with both ends thereof connected respectively to both ends of the frame parts 54a, 54a. According to the present embodiment, the connection parts 56, 56 extend in a straight line parallel to the X axis to connect the frame parts 54b, 54b and the oscillation part 55 to each other. The connection parts 56, 56 are located at ends (node points) in intermediate positions of the oscillation part 55 in the Y-axis direction, that is, in center positions in the oscillation direction of the oscillation part 55.

Figure 13:
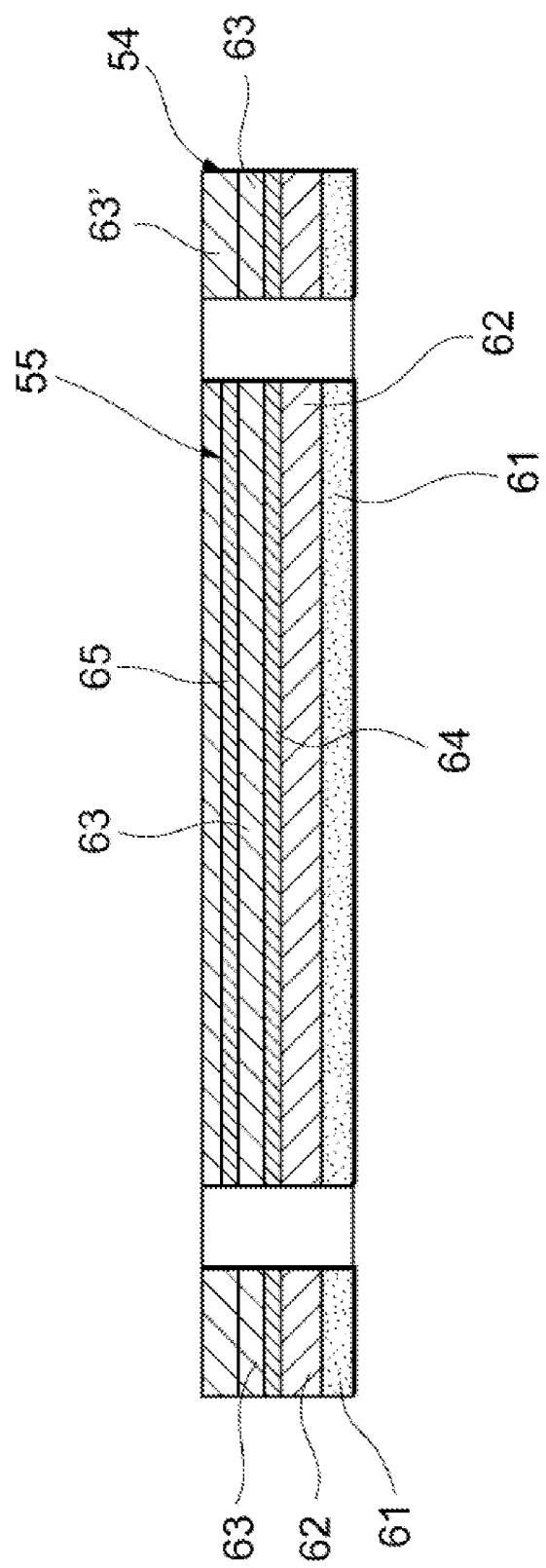
FIG. 13 is a pattern diagram of a cross section of the piezo-resonator along the line 12-12 of FIG. 12.

FIG. 13 is a pattern diagram of a cross section along the line 12-12 of FIG. 12. As is clear from FIG. 13, in the case of piezo-resonator 53, the support frame 54, the oscillation part 55, and the connection parts 56 are formed from: a Si oxide film, that is, a $SiO_2$ layer 61; an active film, that is, a Si layer 62 laminated on the $SiO_2$ layer 61; a piezoelectric thin film, that is, an AlN layer 63 laminated on the Si layer 62; a lower electrode, that is, a Mo layer 64 and an upper electrode, that is, a Mo layer 65 formed on the upper surface and lower surface of the AlN layer 63 to sandwich the AlN layer 63 therebetween; and further an AlN layer 63' laminated on the Mo layer 65. These layers have the same structures as the layers described previously, and the repeated explanations will be thus left out.

In this piezoelectric resonance device 50, the AlN layer 63 is C-axis oriented substantially perpendicular to the Si layer 62. The oscillation part 55 is excited through the application of alternating electric field substantially in the C-axis direction between the Mo layer 64 and the Mo layer 65. As a result, the oscillation part 55 undergoes stretching oscillation in the shorter side direction, that is, the Y-axis direction. In other words, there is stretching oscillation of repeating the stretched oscillation part 55 and the shortened oscillation part 55 in the Y-axis direction. It should be appreciated that the exemplary manufacturing method disclosed herein can be also applied to the piezoelectric resonance device 50.

While the piezoelectric resonance devices 10, 50 according to the embodiments described above have been described to function as timing devices, the devices may be configured to function as, for example, a gyro sensor, an acceleration sensor, a pressure sensor, a microphone, an ultrasonic transducer, an energy harvester, or a RF (high-frequency) filter.

It is noted that the foregoing respective embodiments are intended to facilitate understanding of the present disclosure, but not intended to construe the exemplary embodiments in any limited way. Modifications and/or improvements can be made without departing from the spirit of the invention, and the exemplary embodiments encompass equivalents thereof. More specifically, the scope of the present disclosure also encompasses therein the respective embodiments with design changes appropriately made thereto by one skilled in the art. For example, the respective elements included in the respective embodiments, and the layout, materials, conditions, shapes, sizes, and the like of the elements are not to be considered limited to those exemplified, but may be changed appropriately. In addition, the respective elements included in the respective elements may be combined as long as the combinations are technically possible, and the scope of the present disclosure also encompasses therein the combinations as long as the combinations have the features of the present disclosure.

DESCRIPTION OF REFERENCE SYMBOLS

13: resonator (piezo-resonator)
21: Si oxide film
23: piezoelectric thin film
34: Si wafer
35: Si oxide film
37: piezoelectric thin film
53: resonator (piezo-resonator)
61: Si oxide film
63: piezoelectric thin film

The invention claimed is:

1. A method for manufacturing a resonator, the method comprising:
   setting a thickness of an Si oxide film for the resonator based on a doping amount of impurity in a degenerated Si wafer and based on a frequency-temperature characteristic of the resonator; and
   forming the Si oxide film having the set thickness on a surface of the degenerated Si wafer.

2. The method for manufacturing a resonator according to claim 1, further comprising specifying the doping amount of impurity based on an average for the doping amount of impurity in an in-plane direction of the degenerated Si wafer.

3. The method for manufacturing a resonator according to claim 2, further comprising setting the thickness of the Si oxide film, such that the Si oxide film is configured to cause a frequency-temperature characteristic range of the resonator to reach a minimum value.

4. The method for manufacturing a resonator according to claim 1, further comprising trimming the Si oxide film to set the thickness of the Si oxide film based on the doping amount of impurity in the degenerated Si wafer, such that the frequency-temperature characteristic of the resonator is uniform in plane with the degenerated Si wafer.

5. The method for manufacturing a resonator according to claim 1, the method further comprising:
   setting a thickness of a resonator-constituting thin film based on a distribution of the doping amount of impurity in the degenerated Si wafer in an in-plane direction thereof; and
   forming the resonator-constituting thin film having the set thickness on a surface of the degenerated Si wafer.

6. The method for manufacturing a resonator according to claim 5, further comprising setting a thickness distribution of the resonator-constituting thin film based on the doping amount of impurity and a temperature coefficient of elastic constant of the resonator.

7. The method for manufacturing a resonator according to claim 5, wherein the resonator-constituting thin film comprises at least one of a piezoelectric film formed on the degenerated Si wafer; an upper electrode and a lower electrode formed to sandwich the piezoelectric film therebetween; an additional thin film layer formed between the degenerated Si wafer and the lower electrode; and an additional thin film layer formed over the upper electrode.

8. A method for manufacturing a resonator comprising:
setting a thickness of an Si oxide film for the resonator based on a doping amount of impurity in a degenerated Si wafer;
forming the Si oxide film having the set thickness on a surface of the degenerated Si wafer;
setting a thickness of a piezoelectric film based on a distribution of the doping amount of impurity in the degenerated Si wafer in an in-plane direction thereof; and
forming the piezoelectric film having the set thickness on a surface of the degenerated Si wafer.

9. The method for manufacturing a resonator according to claim 8, further comprising setting the thickness of the piezoelectric film with a thickness distribution based on the doping amount of impurity and a temperature coefficient of elastic constant of the resonator.

10. The method for manufacturing a resonator according to claim 9, further comprising setting the thickness distribution of the piezoelectric film, such that the piezoelectric film is configured to cause the temperature coefficient of elastic constant of the resonator to reach a maximum value.

11. The method for manufacturing a resonator according to claim 8, further comprising setting a thickness distribution of the piezoelectric film in a radial direction, such that piezoelectric film is configured to cause a frequency-temperature characteristic range of the resonator to reach a minimum value.

12. A method for manufacturing a resonator, the method comprising:
setting a thickness of a piezoelectric film based on a distribution of a doping amount of impurity in a degenerated Si wafer in an in-plane direction thereof and based on a frequency-temperature characteristic of the resonator; and
forming the piezoelectric film having the set thickness on a surface of the degenerated Si wafer.

13. The method for manufacturing a resonator according to claim 12, further comprising setting a thickness distribution of the piezoelectric film, such that the piezoelectric film is configured to cause the temperature coefficient of elastic constant of the resonator to reach a maximum value.

14. The method for manufacturing a resonator according to claim 12, further comprising setting a thickness distribution of the piezoelectric film in a radial direction, such that piezoelectric film is configured to cause a frequency-temperature characteristic range of the resonator to reach a minimum value.

* * * * *